United States Patent [19]

Henderson et al.

[11] Patent Number: 5,474,652

[45] Date of Patent: Dec. 12, 1995

[54] METHOD OF DRY ETCHING INALAS AND INGAAS LATTICE MATCHED TO INP

[75] Inventors: Timothy S. Henderson, Richardson; Donald L. Plumton, Dallas, both of Tex.

[73] Assignee: Texas Instruments Incorporated, Dallas, Tex.

[21] Appl. No.: 333,124

[22] Filed: Nov. 1, 1994

Related U.S. Application Data

[63] Continuation of Ser. No. 103,608, Aug. 6, 1993, abandoned, which is a continuation of Ser. No. 668,008, Mar. 12, 1991, abandoned.

[51] Int. Cl.$^6$ .................................................. H01L 21/00
[52] U.S. Cl. .................. 156/662.1; 437/126; 437/133
[58] Field of Search .................................. 156/643, 646, 156/664, 662; 437/126, 133

[56] References Cited

U.S. PATENT DOCUMENTS

| | | | |
|---|---|---|---|
| 4,372,807 | 2/1983 | Vossen et al. | 156/656 |
| 4,547,261 | 10/1985 | Maa et al. | 156/656 |
| 4,618,398 | 10/1986 | Nawata et al. | 156/643 |
| 4,742,026 | 5/1988 | Votus et al. | 156/646 |
| 4,786,361 | 11/1988 | Sekine et al. | 156/643 |
| 4,830,705 | 5/1989 | Loewenstein et al. | 156/646 |
| 4,855,017 | 8/1989 | Douglas | 156/648 |
| 4,872,944 | 10/1989 | Rufin et al. | 156/646 |
| 4,925,813 | 5/1990 | Autier et al. | 156/646 |
| 5,017,511 | 5/1991 | Elkind et al. | 156/643 |
| 5,068,007 | 11/1991 | Rogers et al. | 156/643 |

FOREIGN PATENT DOCUMENTS 0416787 3/1991 European Pat. Off. .

*Primary Examiner*—R. Bruce Breneman
*Assistant Examiner*—George Goudreau
*Attorney, Agent, or Firm*—Michael K. Skrehot; James C. Kesterson; Richard L. Donaldson

[57] ABSTRACT

A method of etching Group III-V semiconductor materials wherein a plasma of methane, hydrogen and freon is provided in a reactive ion etching chamber having a semiconductor substrate therein and maintaining the substrate to be etched at an elevated temperature of about 100° C. in vacuum conditions of from about 1 to about 100 milliTorr. The temperature range utilized herein is substantially higher than the temperatures used in prior art reactive ion etching of Group III-V compositions and provides substantially superior results as compared with tests of reactive ion etching using all materials and parameters used herein except that the temperature of the substrate being etched was about 34° C. The amount of methane can be from a flow rate of about 5 zero to about 50 SCCM and preferably about 10 SCCM, the flow rate of hydrogen can be from about zero to about 40 SCCM and preferably about 30 SCCM and the flow rate of freon can be from about 5 to about 50 SCCM and preferably about 17 SCCM. By this procedure, functional InAlAs/InGaAs heterojunction bipolar transistors (HBTs) and HBT circuits can be fabricated using a dry etch. Also, self-aligned small geometry structures such as, for example, emitter HBTs and ring oscillator and comparator circuits composed of HBTs and both electronic and optical devices, such as lasers, can be fabricated using the above described procedures.

19 Claims, No Drawings

METHOD OF DRY ETCHING INALAS AND INGAAS LATTICE MATCHED TO INP

This application is a continuation application under 37 C.F.R. §1.62 of prior application Ser. No. 08/103,608, filed on Aug. 6, 1993, now abandoned, which is a continuation of prior application Ser. No. 07/668,008, filed on Mar. 12, 1991, now abandoned.

BACKGROUND OF THE INVENTION

1. Field of the Invention

This invention relates to a method of dry etching InAlAs as well as other Group III-V semiconductor compounds.

2. Brief Description of the Prior Art

In accordance with the prior art, Group III-V semiconductor compounds lattice matched to InP have generally been dry etched using a chlorine-based or methane and hydrogen plasma at about room temperature (about 34° C.). While this etching procedure and composition has provided satisfactory results, it has not been capable of etching all semiconductor compositions of the Group III-V type which are lattice matched to InP at sufficiently high rates of speed, this being particularly apparent in the case of InAlAs. It is therefore evident that an etchant which is capable of etching InAlAs at etching rates comparable to the etching rates presently available for other Group III-V semiconductor compounds lattice matched to InP would be highly useful in the fabrication of such Group III-V semiconductor devices.

Niggebrugge et al. demonstrated reactive ion etching (RIE) of InP using methane and hydrogen. They observed that in reaction products have a low volatility and mentioned that $CCl_2F_2/Ar/O_2$, $Cl_2O_2$, $SiCl_4$ and $CCl_4/O_2$ have been previously used to etch InP. This is set forth in Institute of Physics Conference Series No. 79, Chapter 6, pp. 367–372, International Symposium on GaAs and Related Compounds, Karuizawa, Japan (1985).

I. Adesida et al. disclosed etching of InP, InGaAs and InAlAs using $CH_4/H_2$, $CH_4/He$ and $CH_4/Ar$. They observed that the etching of InAlAs is predominantly through sputtering with etch rates under 150 Angstroms/minute at room temperature. This is set forth in GaAs and Related Compounds 1988, Institute of Physics Conference Series 96, pp. 425–429, 1989.

T. R. Hayes et al. has also reported on etching InP, InGaAs and InAlAs at room temperature using $CH_4/H_2$. This is set forth in Journal of Vacuum Science Technology Bulletin, Vol. 8, No. 1, Jan./Feb. 1990, pp. 57–67. The InAlAs etch rate was a maximum of 200 Angstroms/minute using $C_2H_6/H_2$. They also reported etching InAlAs with $CCl_2F_2/O_2$, but with a very poor surface morphology.

SUMMARY OF THE INVENTION

In accordance with the present invention, the above noted problem of the prior art is solved by the use of a dry etching procedure whereby InAlAs can be etched at rates higher than the etching rates therefor obtained with the prior art procedures and compositions resulting in a smooth etched surface.

Briefly, the above is accomplished by providing a plasma of hydrocarbon, preferably methane or ethane, a carrier gas, preferably hydrogen, helium or argon and an etchant, preferably a fluorocarbon which is preferably freon ($CCl_2F_2$) or $BCl_3$ and maintaining the substrate to be etched at an elevated temperature of about 50° to about 150° C. and preferably 100° C. in vacuum conditions of from about 10 to about 50 milliTorr. The temperature range utilized herein is substantially higher than the temperatures used in prior art reactive ion etching of Group III-V compositions and provides substantially superior results as compared with tests of reactive ion etching using all materials and parameters used in accordance with the present invention except that the temperature of the substrate being etched was about 34° C. The flow rate of the hydrocarbon, preferably methane or ethane, can be from about 5 sccm to about 50 SCCM of the total etching composition by volume and preferably about 10 SCCM, the flow rate of carrier gas, preferably hydrogen, can be from about zero to about 40 SCCM of the total etching composition by volume and preferably about 30 SCCM and the amount of etchant, preferably freon, can be from about 5 sccm to about 50 SCCM of the total etching composition by volume and preferably about 17 SCCM. By this procedure, for example, functional InAlAs/InGaAs heterojunction bipolar transistors (HBTs) and HBT circuits can and have been fabricated using a dry etch as discussed by T. Henderson et al., IEEE Transactions on Electron Devices, Vol. 37, pp. 1537–1539, 1990. The above described etching procedure and composition can also be used to fabricate self-aligned, small geometry structures such as, for example, self-aligned emitter HBTs and ring oscillator and comparator circuits composed of HBTs. The above described procedures can be used for fabrication of both electronic and optical devices, such as lasers, light emitting diodes and photodetectors.

DESCRIPTION OF THE PREFERRED EMBODIMENTS

EXAMPLE 1

An InP substrate with a 1 micrometer thick layer of InAlAs thereon was cleaned with solvents tetrachloroethylene, methanol, acetone and deionized water and a thin stripe thereon was then covered by painting a photoresist on the stripe having the rest of the wafer exposed. The wafer was then exposed to a short heating cycle to bake the photoresist for 1 minute at 100° C. The wafer was then placed in a 40:1 water to ammonium hydroxide solution for 30 seconds and then rinsed in deionized water for one minute. The wafer was then placed in a standard reactive ion etching chamber and cleaned with a hydrogen plasma in standard manner under conditions of 30 SCCM hydrogen at 30 milliTorr for 2 minutes at 100 watts power. The exposed area on the substrate was then subjected to a reactive ion etch in the reactive ion etching chamber by applying a plasma composed of 30 SCCM hydrogen, 10 SCCM methane and 17 SCCM $CCl_2F_2$ for 10 minutes at a temperature of 100° C. at a power of 200 watts. The etch rate was found to be 300 Angstroms per minute with total etching being 3000 Angstroms over the 10 minute etching period.

EXAMPLE 2

The above noted procedure was duplicated except that an InP substrate with a 1 micrometer thick layer of InGaAs was substituted for the InAlAs layer. The etch rate was found to be 440 Angstroms per minute with a total etching of 4400 Angstroms over the 10 minute etch period.

EXAMPLE 3

The above noted procedure was duplicated except that a bare InP substrate was substituted for the InP substrate with the thick InAlAs layer. The etch rate was found to be 480 Angstroms over the 10 minute etch period. The substrate temperature was 30° C.

Though the invention has been described with respect to specific preferred embodiments thereof, many variations and modifications will immediately become apparent to those skilled in the art. It is therefore the intention that the appended claims be interpreted as broadly as possible in view of the prior art to include all such variation and modification.

We claim:

1. A method of etching a Group III-V semiconductor structure lattice matched to InP comprising the steps of:
   (a) placing a Group III-V semiconductor structure lattice matched to InP in an etching chamber;
   (b) maintaining said structure within said chamber at a temperature from about 30° C. to about 150° C.; and
   (c) etching said structure in said chamber with a plasma etching composition composed of a hydrocarbon and an etchant taken from the group consisting of a fluorocarbon and boron trichloride ($BCL_3$).

2. The method of claim 1 wherein said temperature is about 100° C.

3. The method of claim 1 further including maintaining the pressure in said chamber from about 1 to about 100 milliTorr.

4. The method of claim 2 further including maintaining the pressure in said chamber from about 1 to about 100 milliTorr.

5. The method of claim 1 wherein said etching composition is composed of about 10 SCCM methane, about 30 SCCM hydrogen and about 17 SCCM freon.

6. The method of claim 2 wherein said etching composition is composed of about 10 SCCM methane, about 30 SCCM hydrogen and about 17 SCCM freon.

7. The method of claim 3 wherein said etching composition is composed of about 10 SCCM methane, about 30 SCCM hydrogen and about 17 SCCM freon.

8. The method of claim 4 wherein said etching composition is composed of about 10 SCCM methane, about 30 SCCM hydrogen and about 17 SCCM freon.

9. The method of claim 1 wherein said fluorocarbon is $CCL_2F_2$.

10. The method of claim 2 wherein said fluorocarbon is $CCL_2F_2$.

11. The method of claim 3 wherein said fluorocarbon is $CCL_2F_2$.

12. The method of claim 4 wherein said fluorocarbon is $CCL_2F_2$.

13. The method of claim 5 wherein said freon is $CCL_2F_2$.

14. The method of claim 6 wherein said freon is $CCL_2F_2$.

15. The method of claim 7 wherein said freon is $CCL_2F_2$.

16. The method of claim 8 wherein said freon is $CCL_2F_2$.

17. The method of claim 1, wherein:
   (a) said etching composition includes a carrier gas selected from the group consisting of hydrogen, helium, and argon.

18. The method of claim 17, wherein:
   (a) the ratio of the flow of said hydrocarbon to the flow of said etchant in said etching chamber is in the range of 0.1 to 10; and
   (b) the ratio of the flow of said carrier gas to the flow of said etchant in said chamber is in the range of 0 to 8.

19. The method of claim 1, wherein:
   (a) the ratio of the flow of said hydrocarbon to the flow of said etchant in said etching chamber is in the range of 0.1 to 10.

* * * * *